(12) United States Patent
Yu et al.

(10) Patent No.: US 6,672,941 B1
(45) Date of Patent: Jan. 6, 2004

(54) METHOD AND APPARATUS FOR CHEMICAL/MECHANICAL PLANARIZATION (CMP) OF A SEMICONDUCTOR SUBSTRATE HAVING SHALLOW TRENCH ISOLATION

(75) Inventors: Chen-Hua Yu, Hsin-Chu (TW); Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 224 days.

(21) Appl. No.: 09/696,087

(22) Filed: Oct. 26, 2000

Related U.S. Application Data

(62) Division of application No. 09/192,518, filed on Nov. 16, 1998, now Pat. No. 6,165,052.

(51) Int. Cl.$^7$ .............. B24B 1/00; B24B 49/00; B24B 51/00
(52) U.S. Cl. .............. 451/9; 451/8; 451/66; 451/288; 451/41
(58) Field of Search ............. 216/88, 89; 438/692, 438/693; 451/8, 10, 41, 54, 57, 59, 63, 65, 66, 67, 9, 285, 286, 287, 288, 289, 290

(56) References Cited

U.S. PATENT DOCUMENTS

| | | | |
|---|---|---|---|
| 4,141,180 A | * 2/1979 | Gill et al. ............. | 451/276 |
| 4,671,851 A | 6/1987 | Beyer et al. ............. | 156/645 |
| 4,680,893 A | * 7/1987 | Cronkhite et al. ........ | 451/287 |
| 5,575,706 A | 11/1996 | Tsai et al. ............. | 451/41 |
| 5,665,202 A | 9/1997 | Subramanian et al. ...... | 438/692 |
| 5,816,891 A | * 10/1998 | Woo ..................... | 451/36 |
| 5,897,426 A | * 4/1999 | Somekh ................. | 451/41 |
| 6,045,434 A | * 4/2000 | Fisher et al. .......... | 451/6 |
| 6,108,091 A | * 8/2000 | Pecen et al. ........... | 356/369 |
| 6,227,950 B1 | * 5/2001 | Hempel et al. .......... | 451/288 |
| 6,332,826 B1 | * 12/2001 | Katsuoka et al. ........ | 451/173 |

OTHER PUBLICATIONS

Chang et al, "ULSI Technology", The McGraw–Hill Industries, New York, 1996, p. 434–439.

* cited by examiner

Primary Examiner—Timothy V. Eley
(74) Attorney, Agent, or Firm—George O. Saile; Stephen B. Ackerman; Billy Knowles

(57) ABSTRACT

A method to planarize the surface of a semiconductor substrate having shallow trench isolation (STI) reduces erosion of a silicon nitride planarization stop layer, reduces dishing of large areas of the shallow trench isolation, and prevents under polishing of the surface of the semiconductor substrate that will leave portions of the silicon dioxide that fills the shallow trenches covering the silicon nitride planarization stop exposed, is described. The method to planarize the surface of a semiconductor substrate having shallow trenches begins by chemical/mechanical planarization polishing at a first product of platen pressure and platen speed to planarize the semiconductor substrate. Polishing at a first product of platen pressure and platen speed will cause a high rate of material removal with low selectivity to increase production throughput. The silicon nitride stop layer will be examined to determine an end point exposure of the silicon nitride stop layer. When the end point exposure of the silicon nitride stop layer is reached, chemical/mechanical planarization polishing at a low product of platen pressure and platen speed is started to planarize the semiconductor substrate of slow over polish to control thickness of a trench oxide of the shallow trench isolation to reduce dishing and minimize erosion. The method further has the step of buffing the surface of the semiconductor substrate to remove any residue from the chemical/mechanical planarization polishing and to remove any microscratches from the surface of the semiconductor substrate.

9 Claims, 4 Drawing Sheets

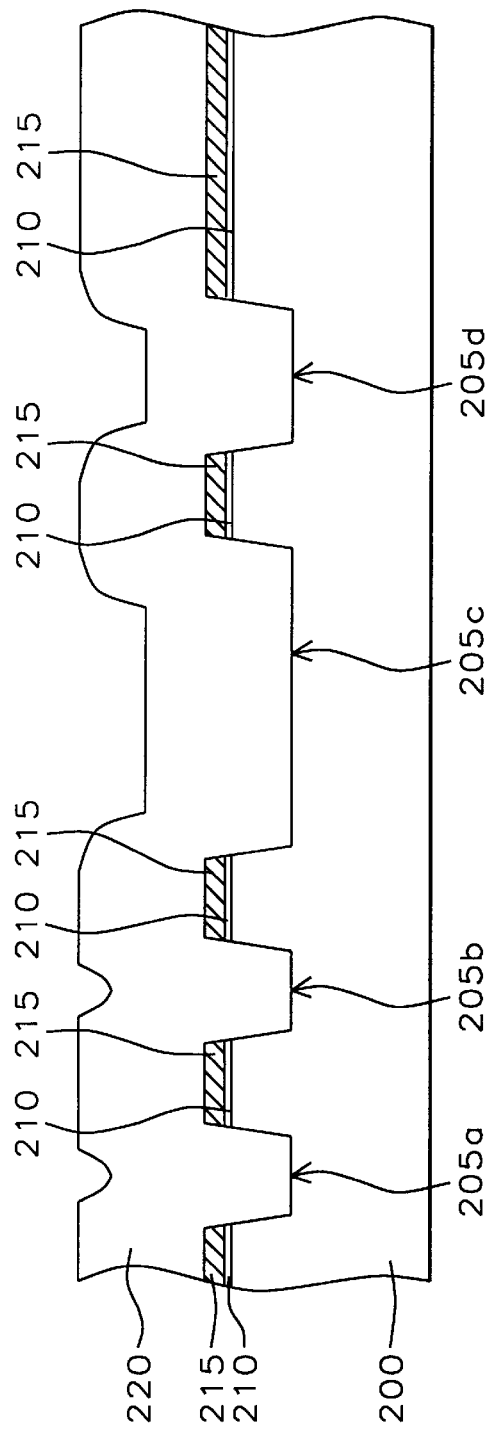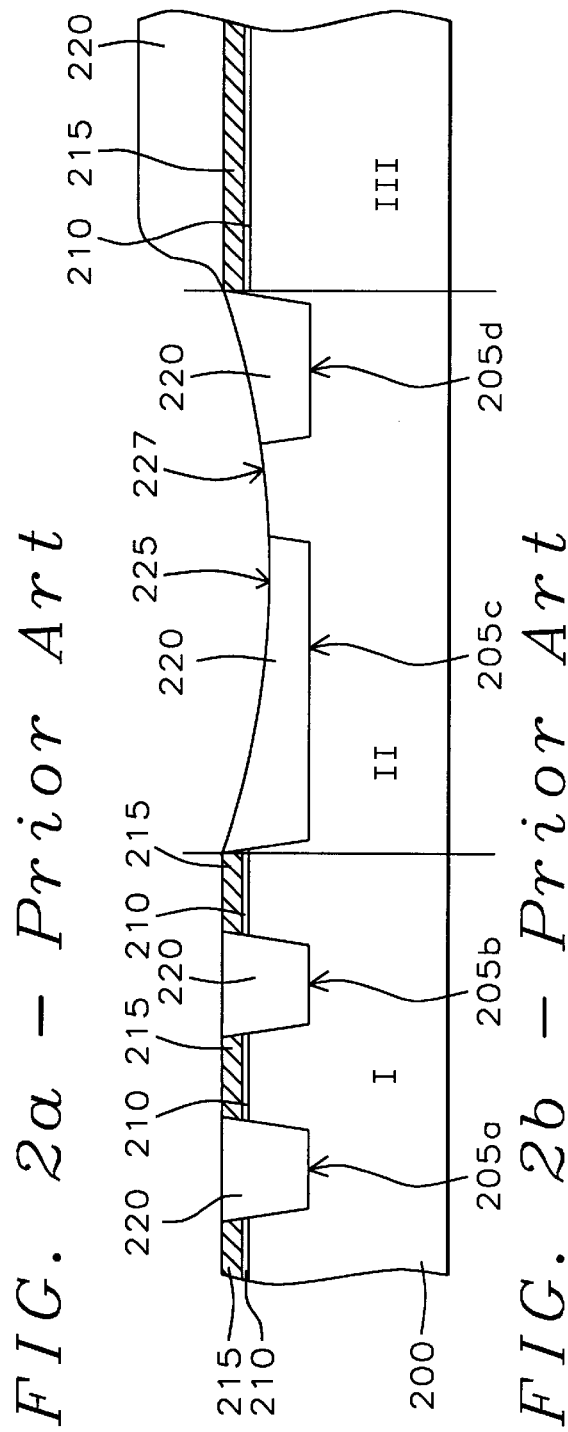
FIG. 2a – Prior Art
FIG. 2b – Prior Art

METHOD AND APPARATUS FOR CHEMICAL/MECHANICAL PLANARIZATION (CMP) OF A SEMICONDUCTOR SUBSTRATE HAVING SHALLOW TRENCH ISOLATION

This is a division of patent application Ser. No. 09/192,518, filing date Nov. 16, 1998, now U.S. Pat. No. 6,165,052. A Method And Apparatus For Chemical/Mechanical Planarization (Cmp) Of A Semiconductor Substrate Having Shallow Trench Isolation, assigned to the same assignee as the present invention.

BACKGROUND OF THE INVENTION

1. Field of the Invention

This invention relates to methods and apparatus for chemical/mechanical planarization (CMP) of a semiconductor substrate.

More particularly, this invention relates to methods and apparatus to planarize a semiconductor substrate having shallow trench isolation while reducing dishing and minimizing erosion of silicon nitride on the surface of the semiconductor substrate.

2. Description of Related Art

Chemical/mechanical planarization (CMP) of a semiconductor substrate is well known in the art. A description of CMP is found in *ULSI Technology*, Chang and Sze, McGraw-Hill Co. Inc., New York, N.Y., 1996, pp. 434–439 and is shown in FIG. 1. The requirements for polishing a dielectric are the removal of material while maintaining uniformity across the entire semiconductor substrate. The CMP involves the use of chemistry as well as mechanical abrasion for the removal of material.

A polishing station 100 of CMP machine is equipped with a rotating platen 5. A polishing pad 10 is attached to the platen 5. A semiconductor substrate 20 is secured to the wafer carrier 15. The wafer carrier 15 is lowered to place the semiconductor substrate 20 in contact with the polishing pad 10. The wafer carrier 15 is rotated at a speed independent of the platen 5 and the wafer carrier 15 is adjusted to exert force on the platen 5.

A polishing slurry 25 is delivered from the slurry supply 30 to ensure uniform wetting of the polishing pad 10 as well as proper delivery and recovery of the polishing slurry 25. The polishing slurry 25 consists primarily of colloidal silica suspended in a solution of potassium hydroxide (KOH).

A CMP machine will have multiple polishing stations 100 connected by automated cassette-to-cassette handlers and automatic wafer loaders.

The basic polishing mechanism for polishing silicon dioxide ($SiO_2$) dielectric is the same as for glass polishing. The mechanical removal rate is given by Preston's equation:

$$R = K_p pv$$

where:
 R is the rate of removal of material,
 p is the applied pressure between the semiconductor substrate 20 and the platen 5,
 v is the relative velocity between the semiconductor substrate 20 and the platen 5, and
 $K_p$ is a constant of proportionality.

Preston's constant $K_p$ is a function of the mechanical properties of the silicon dioxide dielectric such as hardness and Young's modulus, the polishing slurry, and the structure of the polishing pad.

The above equation is a mechanical description of the rate of removal of material during planarization. However, the microscopic action of polishing is both chemical and mechanical. The exact mechanism of polishing is currently not well understood, but the present description of polishing divides the chemical process into four stages. In the first stage, hydrogen bonds with the oxide surfaces of the semiconductor substrate 20. The second step has the hydrogen bonds of the slurry 25 and semiconductor substrate 20 joining together. In the third step, the silicon of the slurry 25 and the semiconductor substrate 20 are bonded to a common oxygen atom to form a molecular bond. The fourth step has the slurry 25 moving away transporting the molecular silicon with it, thus removing material from the surface of the semiconductor substrate 20.

The above described stages have three important implications: Polishing is not just abrasion of the silica of the slurry 25 against the semiconductor substrate 20. The presence of water and the PH of the solution affect the formation of hydrogen bonds. Further, the size and composition of the particles of the slurry 25 determine the effectiveness. The most common particulate used in the slurry 25 is silica with a particle size of 10 nanometers to 90 nanometers.

It is apparent from Preston's equation that the rate of removal R is directly related to the applied pressure p and the velocity v of platen. The rate of removal of material as shown in FIG. 4 and the selectivity of the chemical/mechanical planarization polishing as shown in FIG. 5 are generally plotted versus the product of platen pressure and platen speed.

Refer now to FIGS. 2a and 2b for a discussion of the problems associated with the current CMP practice of prior art for polishing a semiconductor substrate having shallow trench isolation (STI). A semiconductor substrate 200 has a layer of silicon dioxide $SiO_2$ 210 formed on the top surface. On the layer of $SiO_2$ layer 210, a layer of Silicon Nitride $Si_xN_y$ is deposited to form a planarization stop layer 215.

A photolithographic mask (not shown) is formed on the planarization stop layer 215. The photolithographic mask is exposed to create a pattern for the shallow trenches 205a, 205b, 205c, and 205d that are to be created on the surface of the semiconductor substrate 200. The areas that are to be the shallow trenches 205a, 205b, 205c, and 205d are removed from the photolithographic mask. The surface of the semiconductor substrate 200 is exposed to an etchant to remove the planarization stop layer 215, the $SiO_2$ layer 210, and a portion of the semiconductor substrate 200 to thus form the shallow trenches 205a, 205b, 205c, and 205d. A $SiO_2$ fill 220 is deposited on the surface of the semiconductor substrate 200. The deposition of the $SiO_2$ fill is generally accomplished by a chemical vapor deposition of ozone—Tetraethylorthosilane ($O_3$-TEOS) or by a Spin-On-Glass (SOG) process that is well known in the art. The $SiO_2$ fill 220 is then removed by a CMP process as described above.

The $SiO_2$ fill 220 is intended to be removed until the surface is level with the planarization stop layer 215. However, the CMP process of the prior art causes three types of problems at the surface of the semiconductor substrate 200. The first problem is shown in FIG. 2b section 1. The surface of the semiconductor substrate 200 is over polished causing erosion and thus a thinning of the $Si_xN_y$ planarization stop layer 215.

The second problem is illustrated in FIG. 2b section 11. The surface of the semiconductor substrate 200 is again over polished, however in this instance irregularities in the platen causes over polishing which causes dishing. The dishing is caused in areas of large shallow trenches 205c, and 205d and entirely removes the planarization stop layer 207.

The third problem is shown in FIG. 2b section III. Areas of the surface of the semiconductor substrate 200 are under polished. This leaves areas of $SiO_2$ fill 220 on the surface of the planarization stop layer 215.

U.S. Pat. No. 5,575,706 (Tsai et al.), assigned to the same assignee as this invention, discloses an improved and new apparatus and process for chemical mechanical planarization (CMP) of a semiconductor wafer surface. The polish removal rate is controlled through the application of an electric field between the semiconductor wafer carrier and the polishing pad. Further, application of an electric field between selected regions of the semiconductor wafer carrier and polishing pad affects the polish removal rates in a manner which improves the uniformity of material removal across the entire semiconductor wafer surface. The uniformity of polish removal rate is further controlled through the application of bi-directional electric fields between the semiconductor wafer carrier and the polishing pad.

The novel features of the polishing apparatus of Tsai et al. is applying an electric field between the wafer carrier and polishing platen as a means of controlling the concentration of the polishing slurry across the surface of the semiconductor wafer being polished. The control of the concentration of the slurry and thus of the polish removal rate will improve the uniformity of polish removal rate across the semiconductor wafer surface.

U.S. Pat. No. 4,671,851 (Beyer et al) discloses a method for removing the aspirates, typically the ridge-shaped $SiO_2$ protuberances (so-called "bird's heads") resulting from the ROI process at the surface of the silicon substrate. The invention is accomplished by applying CMP to the surface of the silicon substrate. The silicon substrate has been previously coated with a blanket polishing stop barrier layer, typically of CVD (Chemical Vapor Deposition) of a $Si_3N_4$ layer. The portions of the $Si_3N_4$ layer, located on the curved top of the 'bird's heads" and the underlying $SiO_2$ protuberances, are removed because they are submitted to a considerably higher CMP polishing rate than the portions covering the planar substrate surface. This CVD $Si_xN_y$ layer unexpectedly acts therefore as a polishing or etch stop barrier layer only on the planar portions of the substrate surface. The difference between these polishing rates may be varied simply by controllably applying different pressure magnitudes on the polishing pad. A successful planarization of the protuberances by a CMP polishing process depends on the polishing solution chemistry. In that respect, $SiO_2$ water based slurries have demonstrated their efficiency. Polishing rate ratios between $SiO_2$ and $Si_3N_4$ preferably should be between a lower limit of four to one and a higher limit of forty to one.

U.S. Pat. No. 5,665,202 (Subramanian et al.) teaches a process for polish planarizing a fill material overlying a semiconductor substrate. In one embodiment, a second planarization layer is deposited over a fill material and a portion of the fill material is removed leaving a remaining portion. The pad pressure of a CMP apparatus is adjusted such that a first pressure is generated during the polishing process. Then, the remaining portion is removed, while operating the CMP apparatus at a second pressure. The selectivity of the polishing process is maintained by reducing the pad pressure during the second polishing step. In a second embodiment, after the first polishing step is performed, the remaining portion of the fill material is removed by an etching process using a portion of the second planarization layer.

SUMMARY OF THE INVENTION

An object of this invention is to provide a method to planarize the surface of a semiconductor substrate having shallow trench isolation (STI).

Another object of this invention is to provide a method to planarize the surface of a semiconductor substrate having shallow trench isolation that prevents erosion of a silicon nitride planarization stop layer.

Further another object of this invention is to provide a method to planarize the surface of a semiconductor substrate having shallow trench isolation that prevents dishing of large areas of the shallow trench isolation.

Still further another object of this invention is to provide a method to planarize the surface of a semiconductor substrate having shallow trench isolation that prevents under polishing of the surface of the semiconductor substrate that will leave portions of the silicon dioxide that fills the shallow trenches covering the silicon nitride planarization stop.

To accomplish these and other objects, a method to planarize the surface of a semiconductor substrate having shallow trenches begins by chemical/mechanical planarization polishing at a high product of platen pressure and platen speed to planarize the semiconductor substrate. Polishing at a high product of platen pressure and platen speed will cause a high rate of material removal with low selectivity to increase production throughput. The silicon nitride stop layer will be examined to determine an end point exposure of the silicon nitride stop layer.

When the end point exposure of the silicon nitride stop layer is reached, chemical/mechanical planarization polishing at a low product of platen pressure and platen speed is started to planarize the semiconductor substrate by a slow over polish to control thickness of a trench oxide of the shallow trench isolation to reduce dishing and minimize erosion.

The method further has the step of buffing the surface of the semiconductor substrate to remove any residue from the chemical/mechanical planarization polishing and to remove any microscratches from the surface of the semiconductor substrate.

The method to planarize the surface of a semiconductor substrate having shallow trenches is accomplished on a chemical/mechanical planarization polishing machine. The polishing at a high product of platen pressure and platen speed is accomplished on a first platen of the CMP polishing machine. The polishing at a low product of platen pressure and platen speed is accomplished on a second platen the CMP polishing machine. The buffing is accomplished on a third platen of the CMP polishing machine.

The high product of platen pressure and platen speed is from approximately 500 psi-rpm to approximately 700 psi-rpm, preferably 600 psi-rpm. The platen pressure for the high product of platen pressure and platen speed is most effective from approximately 7 psi to approximately 8 psi.

The low product of platen pressure and platen speed is from approximately 200 psi-rpm to approximately 400 psi-rpm, preferably 300 psi-rpm. The platen pressure for the low product of platen pressure and platen speed is most effective from approximately 3 psi to approximately 4 psi.

BRIEF DESCRIPTION OF THE DRAWINGS

FIGS. 2a and 2b are cross sectional drawings of a semiconductor substrate showing the formation of shallow trench isolation and the problems of the method of planarization of the semiconductor substrate of the prior art.

DETAILED DESCRIPTION OF THE INVENTION

Figure 4:
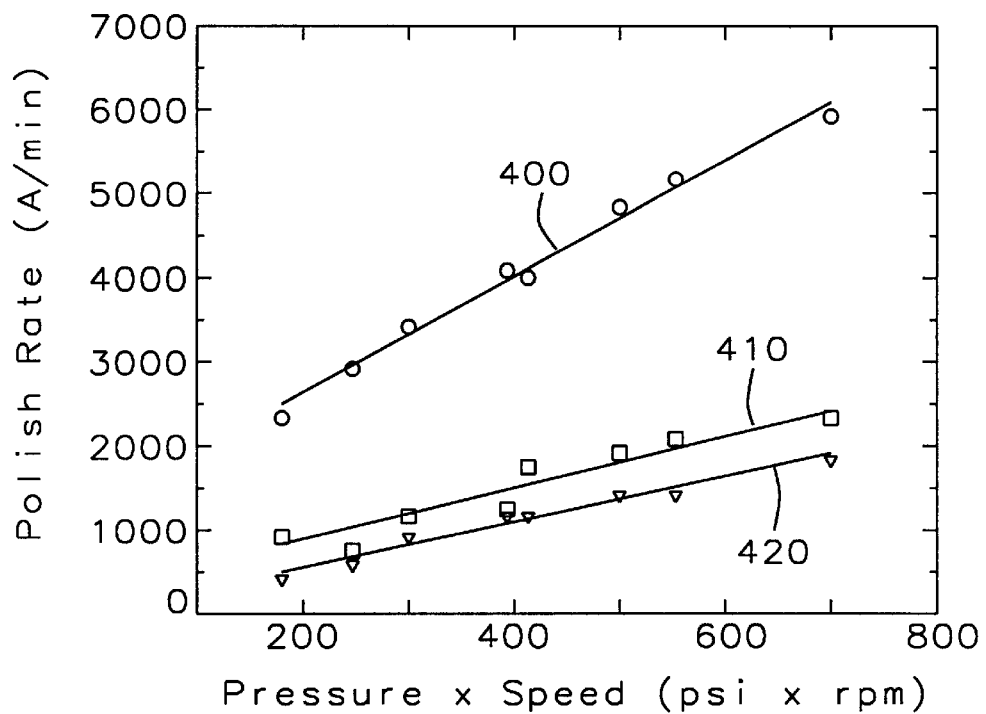
FIG. 4 is a plot of the polishing rates of two.forms of silicon dioxide fill and silicon nitride versus the product of platen pressure and platen speed.

Refer now to FIG. 4 for a discussion of the polish rate or rate of removal of $O_3$-TEOS CVD formed silicon dioxide $SiO_2$ fill 400, silicon nitride $Si_xN_y$ 420, and Spin-On-Glass (SOG) form of $SiO_2$ fill 410. As can be seen, silicon nitride $Si_xN_y$ 420 has the lowest rate of removal of the materials shown. The $O_3$-TEOS CVD formed silicon dioxide $SiO_2$ fill 400 has the most rapid rate of removal of material for a given product of platen pressure and platen speed. The SOG form of silicon dioxide $SiO_2$ fill 410 has a removal rate near that of the silicon nitride $Si_xN_y$ 420.

Thus the $SiO_2$ layer 220 of FIG. 2b can be removed at a rate that is relatively fast by selecting a product of platen pressure and platen speed that is high to allow rapid removal of material. Upon exposing the $Si_xN_y$ planarization stop layer 215, the end point of the high product of platen pressure and platen speed is determined by methods known in the art such as visual inspection or detection of changes in the removal rate. A lower product of platen pressure and platen speed will then slow the removal rate of the materials.

Figure 5:
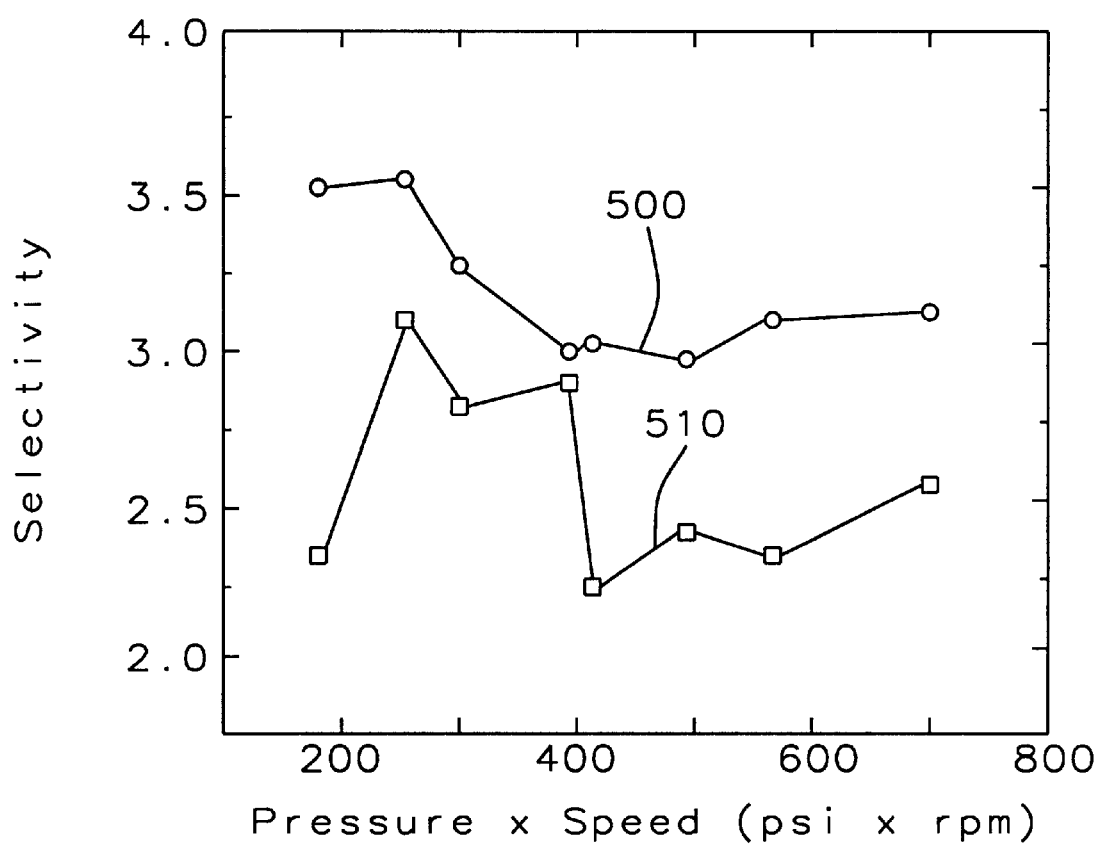
FIG. 5 is a plot of the measure of selectivity of chemical/mechanical planarization versus the product of platen pressure and platen speed for two forms of oxide and ozone-tetraethylorthosilane ($O_3$-TEOS) CVD and silicon nitride.

FIG. 5 shows the selectivity of the removal of material during chemical/mechanical planarization polishing. Selectivity is a comparison of the removal rate of material for two materials. The selectivity of $O_3$-TEOS CVD formed silicon dioxide $SiO_2$ fill and silicon nitride $Si_xN_y$ is shown in plot 500. It is apparent that the $O_3$-TEOS CVD formed silicon dioxide $SiO_2$ fill is removed from approximately 3.0 times to approximately 3.5 times faster than the silicon nitride $Si_xN_y$. Further, the lower product of the platen pressure and the platen speed has a selectivity that is approximately 3.5. Therefore once the silicon nitride $Si_xN_y$ planarization stop layer has been exposed, lowering the product of platen pressure and platen speed will allow better control of the thickness of the $SiO_2$ layer 220 of FIG. 2a. Additionally the lower product of platen pressure and platen speed will reduce the dishing and erosion shown in FIG. 2b, while allowing total removal of the $SiO_2$ layer 220 of section III of FIG. 2b.

Figure 1:
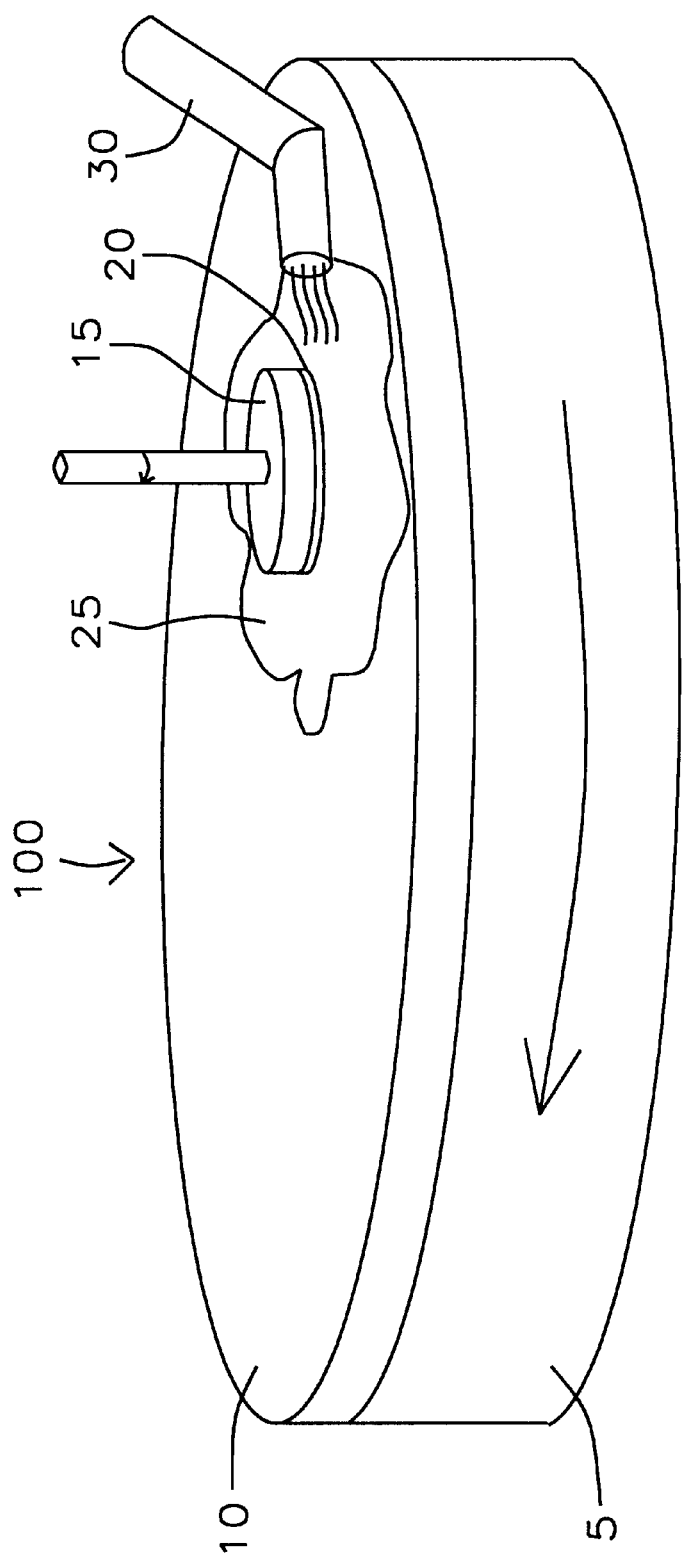
FIG. 1 is a schematic drawing of a polishing station of a chemical/mechanical planarization (CMP) polishing machine.
Figure 3:
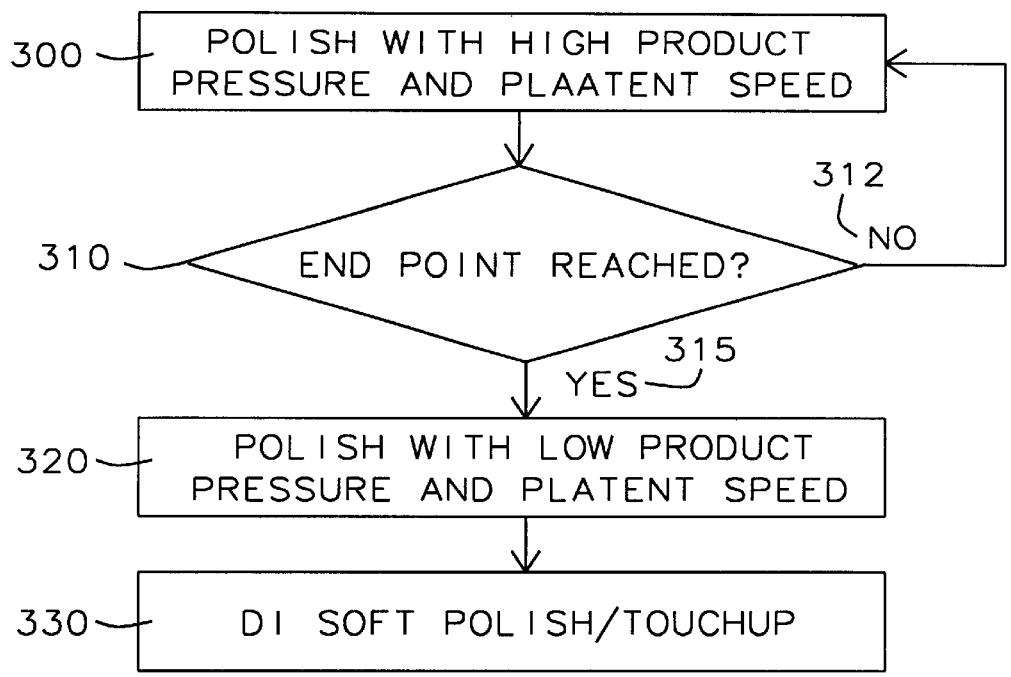
FIG. 3 is a flow chart of the method of planarization of a semiconductor substrate having shallow trench isolation of this invention.

Refer now to FIGS. 1 and 3 to summarize the method to planarize a semiconductor substrate having shallow trench isolation. After the $SiO_2$ layer 220 of FIG. 2a has been deposited on the surface of the semiconductor substrate 200 of FIG. 2a, the semiconductor substrate 20 is secured to the wafer carrier 15. The platen 5 and the wafer carrier 15 are rotated. The platen 5 and the wafer carrier 15 are brought into contact to polish the semiconductor substrate 20. The slurry 25 is introduced to wet the polishing pad 10 on the platen 5. The semiconductor substrate 20 is polished 300 at a high product of platen pressure and platen speed.

The values of high product of platen pressure and platen speed are selected such that the uniformity of the surface of the semiconductor substrate 10 is maintained and the quantity of microscratches is minimized. If the value of the platen pressure is too high and the value of the platen speed is too low, the uniformity of the surface is not maintained.

The high product of platen pressure and platen speed is from approximately 500 psi-rpm to approximately 700 psi-rpm, preferably 600 psi-rpm. The platen pressure for a high product of platen pressure and platen speed is from approximately 7 pounds per square inch (psi) to approximately 8 psi. The high product of platen pressure and platen speed insure rapid material removal from the semiconductor substrate 20 to increase the number of semiconductor substrates 20 processed over time.

The semiconductor substrate 20 is examined to determine 310 whether the silicon nitride planarization stop layer 215 of FIG. 2a is exposed. If the silicon nitride planarization stop layer 215 of FIG. 2a has not been exposed 310 been exposed 312, the semiconductor substrate 20 continues to be polished 300 at a high rate of platen pressure and platen speed.

When the end point of the $SiO_2$ layer 220 of FIG. 2a is achieved 315 and the $Si_xN_y$ planarization stop layer 215 of FIG. 2a has been exposed, the platen pressure and platen speed are adjusted to polish 320 at a low product of platen pressure and platen speed. The low product of platen pressure and platen speed is from approximately 200 psi-rpm to approximately 400 psi-rpm, preferably 300 psi-rpm. The platen pressure for the low product of platen pressure and platen speed is from approximately 3 psi to approximately 4 psi The low product of platen pressure and platen speed increases the selectivity of the polishing as shown in FIG. 5. Polishing 320 with a low product of platen pressure and platen speed allows a slow over polish to better control the thickness of the $SiO_2$ layer 220 of FIG. 2b, while reducing the erosion of the $Si_xN_y$ planarization layer 215 of FIG. 2b section I and the dishing 207 of FIG. 2b section II.

The low product of platen pressure and platen speed is selected to maintain the uniformity of the surface and to minimize the quantity of microscratches. However, if the product of platen pressure and platen speed is too low, the polishing rate is too low and the production rate is effected.

The low product of platen pressure and platen speed is from approximately 200 psi-rpm to approximately 400 psi-rpm, preferably 300 psi-rpm. The platen pressure for the low product of platen pressure and platen speed is most effective from approximately 3 psi to approximately 4 psi.

At the completion of the polishing 320 at a low product of platen pressure and platen speed, the semiconductor substrate 20 is buffed 330 with deionized water on the polishing pad 10 to remove any residue of the slurry from the surface of the semiconductor substrate 20. Further, the buffing removes any microscratches present on the surface of the semiconductor substrate 20.

The method as described can effectively be implemented on a multiple polishing station CMP polishing machine. One station of the CMP polishing machine executes the step of polishing 300 at a high product of platen pressure and platen speed. A second polishing station will execute the step of polishing 320 at a low product of platen pressure and platen speed. The buffing step 330 is executed on a third polishing station. The step of determining 310 the end point of the $SiO_2$ layer 220 of FIG. 2b is executed by measuring the current of the motor driving the wafer carrier 15 of FIG. 1. As the planarization stop layer 215 of FIGS. 2a and 2b is exposed, the silicon nitride $Si_xN_y$ of the planarization stop layer 215 is harder and requires more current in the motor driving the wafer carrier 15 of FIG. 1.

An alternative method of determining 310 the end point of the $SiO_2$ layer 220 of FIG. 2b is measuring the average thickness of the remaining $SiO_2$ layer 220 of FIG. 2b using standard ellipsometry methods.

The semiconductor substrate 20 is transferred from the first polishing station, to the second polishing station, and to the third polishing station by the automated cassette-to-cassette handlers and automatic wafer loaders as above described.

While this invention has been particularly shown and described with reference to the preferred embodiments thereof, it will be understood by those skilled in the art that various changes in form and details may be made without departing from the spirit and scope of the invention.

What is claimed is:

1. A chemical/mechanical planarization apparatus to planarize a surface of a substrate while forming shallow trench isolation to reduce dishing of wide trench shallow trench isolation and to reduce erosion of small silicon nitride areas on the surface of the substrate, comprising:

a first chemical/mechanical planarization platen having a first product of a pressure applied between the substrate and said platen and the relative velocity between the substrate and the platen to chemical/mechanical planarization polish said substrate at a high rate with low selectivity;

an end point determining means to detect while said substrate is being chemical/mechanical planarization polished on the first platen to determine if the surface of the substrate has reached an end point exposure of the silicon nitride areas by measuring techniques selected from a group of measuring techniques consisting of measuring an increase in current of a motor driving a wafer carrier holding said substrate and ellipsometrically measuring said trench oxide overlaying said silicon nitride area; and a second chemical/mechanical planarization polishing platen having a second product of the pressure applied between the substrate and the platen and the relative velocity between the substrate and the platen to chemical/mechanical planarization polish, after the end point exposure of the silicon nitride areas is reached, to slowly over polish the surface of the substrate to control the thickness of a trench oxide of the shallow trench isolation to reduce dishing and reduce erosion of the silicon nitride areas.

2. The apparatus of claim 1 further comprising a buffing platen to buff the surface of the substrate subsequent to the chemical/mechanical planarization polishing of said substrate, to remove residue of said chemical/mechanical planarization polishing, and to remove microscratches from said surface of the substrate.

3. The apparatus of claim 1 wherein the first product of the pressure applied between the substrate and the platen and the relative velocity between the substrate and the platen is greater than the second product of the pressure applied between the substrate and the platen and the relative velocity between the substrate and the platen.

4. The apparatus of claim 1 wherein the first product of the pressure applied between the substrate and the platen and the relative velocity between the substrate and the platen is from approximately 500 psi-rpm to approximately 700 psi-rpm.

5. The apparatus of claim 1 wherein the second product of the pressure applied between the substrate and the platen and the relative velocity between the substrate and the platen is from approximately 200 psi-rpm to approximately 400 psi-rpm.

6. The apparatus of claim 1 wherein the pressure applied between the substrate and the platen for the first product of the pressure applied between the substrate and the platen and the relative velocity between the substrate and the platen is from approximately 7 psi to approximately 8 psi.

7. The apparatus of claim 1 wherein the pressure applied between the substrate and the platen for the second product of the pressure applied between the substrate and the platen and the relative velocity between the substrate and the platen is from approximately 3 psi to approximately 4 psi.

8. The apparatus of claim 1 wherein the first product of the pressure applied between the substrate and the platen and the relative velocity between the substrate and the platen is approximately 600 psi-rpm.

9. The apparatus of claim 1 wherein the second product of the pressure applied between the substrate and the platen and the relative velocity between the substrate and the platen is approximately 300 psi-rpm.

* * * * *